United States Patent
Ovchinnikov et al.

(10) Patent No.: US 7,856,584 B2
(45) Date of Patent: Dec. 21, 2010

(54) UNEQUAL ERROR PROTECTION APPARATUS, SYSTEMS, AND METHODS

(75) Inventors: Andrei A. Ovchinnikov, St. Petersburg (RU); Andrey Vladimirovich Belogolovy, Saint Petersburg (RU); Evgeny A. Kruk, Saint Petersburg (RU)

(73) Assignee: Intel Corporation, Santa Clara, CA (US)

( * ) Notice: Subject to any disclaimer, the term of this patent is extended or adjusted under 35 U.S.C. 154(b) by 740 days.

(21) Appl. No.: 11/577,035

(22) PCT Filed: Mar. 30, 2005

(86) PCT No.: PCT/RU2005/000152

§ 371 (c)(1),
(2), (4) Date: Apr. 11, 2007

(87) PCT Pub. No.: WO2006/130033

PCT Pub. Date: Dec. 7, 2006

(65) Prior Publication Data

US 2008/0086672 A1    Apr. 10, 2008

(51) Int. Cl.
*H03M 13/00* (2006.01)
(52) U.S. Cl. ..................... 714/752; 714/790
(58) Field of Classification Search .......... 714/752, 714/774, 790; 375/240.24, 264, 286
See application file for complete search history.

(56) References Cited

U.S. PATENT DOCUMENTS

| | | | |
|---|---|---|---|
| 3,806,883 A | | 4/1974 | Weisbecker |
| 5,467,132 A | * | 11/1995 | Fazel et al. ............ 375/240.01 |
| 5,691,992 A | * | 11/1997 | Molnar et al. ............... 714/752 |
| 6,031,874 A | * | 2/2000 | Chennakeshu et al. ...... 375/262 |
| 6,292,917 B1 | * | 9/2001 | Sinha et al. .................. 714/752 |
| 6,665,831 B1 | * | 12/2003 | Yoshida et al. .............. 714/774 |
| 6,694,474 B2 | * | 2/2004 | Ramprashad et al. ....... 714/755 |
| 6,854,082 B1 | * | 2/2005 | Rhee ........................... 714/755 |
| 7,168,033 B1 | | 1/2007 | Wu et al. |
| 7,190,732 B2 | * | 3/2007 | Chung et al. ................ 375/261 |
| 2003/0033570 A1 | | 2/2003 | Khannanov et al. |
| 2007/0271496 A1 | | 11/2007 | Krouk et al. |
| 2008/0086670 A1 | | 4/2008 | Krouk et al. |
| 2008/0320362 A1 | | 12/2008 | Taubin et al. |

FOREIGN PATENT DOCUMENTS

SU        985959       12/1982
WO    WO-2006/073322 A1    7/2006

(Continued)

OTHER PUBLICATIONS

"China Application Serial No. 200480044722.1, Office Action mailed Aug. 7, 2009", 33 pgs.

(Continued)

*Primary Examiner*—Esaw T Abraham
(74) *Attorney, Agent, or Firm*—Schwegman, Lundberg & Woessner, P.A.

(57) ABSTRACT

Apparatus and systems, as well as methods and articles, encode a data word into an unequal error protection (UEP) codeword and transmit first and second portions of the UEP codeword associated with first and second protection levels across first and second sub-channel subsets associated with first and second error probabilities and a multi-channel communications link, respectively.

23 Claims, 3 Drawing Sheets

FOREIGN PATENT DOCUMENTS

| WO | WO-2006/073324 A1 | 7/2006 |
|---|---|---|
| WO | WO-2006/075929 A1 | 7/2006 |
| WO | WO-2006/130033 A1 | 12/2006 |

OTHER PUBLICATIONS

"Chinese Application Serial No. 200480044783.8, Office Action dated Jun. 26, 2009", 25 pgs.

"Chinese Application Serial No. 200480044783.8, Office Action Mailed Jan. 8, 2010", 9 pages.

Fan, John L., "Array codes as Low density parity check codes", *Gigabites Wireless Inc*, 4 pgs.

Isaka, M., et al., "On the Iterative Decoding of Multilevel Codes", *IEEE Journal on selected areas in communication*, 19(5), , vol. 19,No. 5, (May 2001), 935-943.

Rao, S., "The 4D-PAM8 proposal for 10GBASE-T", *P802.3 Task Force Meeting*, URL:http://www.ieee802.org/3/IOGBT/public/nov03/rao_1_1103.pdf>, (Nov. 10, 2003), 1-21.

Yi, Y., et al., "Design of Semi-Algebraic Low-Density Parity-Check (SA-LDPC) Codes for Multilevel Coded Modulation", *Proc. 4th IEEE International Conference on Parallel and Distributed Computing, Applications and Technologies*, (Aug. 27, 2003), 931-934.

Kousa, M. A., et al., "Multichannel Adaptive System", *IEE Proceedings I. Solid-State & Electron Devices, Institution of Electrical Engineers*, 140(5) Part-I, (Oct. 1, 1993),357-364.

Kumar, V., et al., "On Unequal ErrolTProtection LDPC Codes Based on Plotkin-type Constructions", *Globecom 2004, Global Telecommunications Conference, IEEE Communications Society*, (Nov. 29, 2004),493-497.

"International Search Report for Application No. PCT/RU2005/000152, date mailed Feb. 6, 2006," 5 pgs.

"Written Opinion of the International Search Authority for Application No. PCT/RU2005/000152, date mailed Feb. 6, 2006," 5 pgs.

"European Application Serial No. 02768734.2, Office Action mailed Dec. 15, 2008", 4 pgs.

"International Application Serial No. PCT/RU2004/000536, Search Report dated May 10, 2005", 3 pgs.

"International Application Serial No. PCT/RU2004/000536, Written Opinion dated May 10, 2005 Written Opinion", 6 pgs.

Gilbert, E N, "A problem in binary coding", *In Proceedings of the Symposium in Applied Mathematics*, vol. 10, (1960), 291-97.

Krouk, E A, et al., "Low-density parity-check burst error-correcting codes", *In 2nd International Workshop Algebraic and combinatorial coding theory, Leningrad*, 1990., 3 pgs.

"U.S. Appl. No. 11/664,147, Non-Final Office Action mailed Jun. 10, 2010", 15 pgs.

"Chinese Application Serial No. 200480044785.7, Office Action mailed Apr. 21, 2010", 11 pgs.

Kou, Y, et al., "Low-density parity-check codes based on finite geometries: a rediscovery and new results", *IEEE Transactions on Information Theory*, 47(7), (2001), 2711-2736.

\* cited by examiner

UNEQUAL ERROR PROTECTION APPARATUS, SYSTEMS, AND METHODS

RELATED APPLICATIONS

This application is a U.S. National Stage Filing under 35 U.S.C. 371 from International Patent Application No. PCT/RU2005/000152, filed on Mar. 30, 2005, and published in English as WO 2006/130033 A1 on Dec. 7, 2006, which is incorporated herein by reference.

TECHNICAL FIELD

Various embodiments described herein relate to communications generally, including apparatus, systems, and methods used in error correction operations.

BACKGROUND INFORMATION

Some information transmission schemes, including frequency-division multiplexing, orthogonal frequency-division multiplexing (OFDM), and discrete multi-tone transmission, split data into several sub-channels prior to transmission. These schemes may be used in conjunction with forward error correction (FEC) techniques to encode data words and increase transmission reliability across the several sub-channels. However, some of the sub-channels (or groups thereof) may experience greater interference, noise, or channel fade than others, resulting in different channel transfer coefficients among channels, along with increased error rates and decreased system throughput.

SUMMARY

In some embodiments an apparatus includes a first encoder to encode a data word at a first code distance within a selected bit constellation utilizing a first unequal error protection (UEP) code to yield a first portion of a UEP codeword to be transmitted across a first channel subset of a multi-channel communications link, wherein the first channel subset is associated with a first channel reliability; and a second encoder to encode the data word at a second code distance utilizing a second UEP code to yield a second portion of the UEP codeword to be transmitted across a second channel subset of the multi-channel communications link, wherein the second channel subset is associated with a second channel reliability, the first code distance differs from the second code distance, the first channel reliability differs from the second channel reliability, and at least one of the first UEP code and the second UEP code comprises a low-density parity-check code.

DETAILED DESCRIPTION

Figure 1:
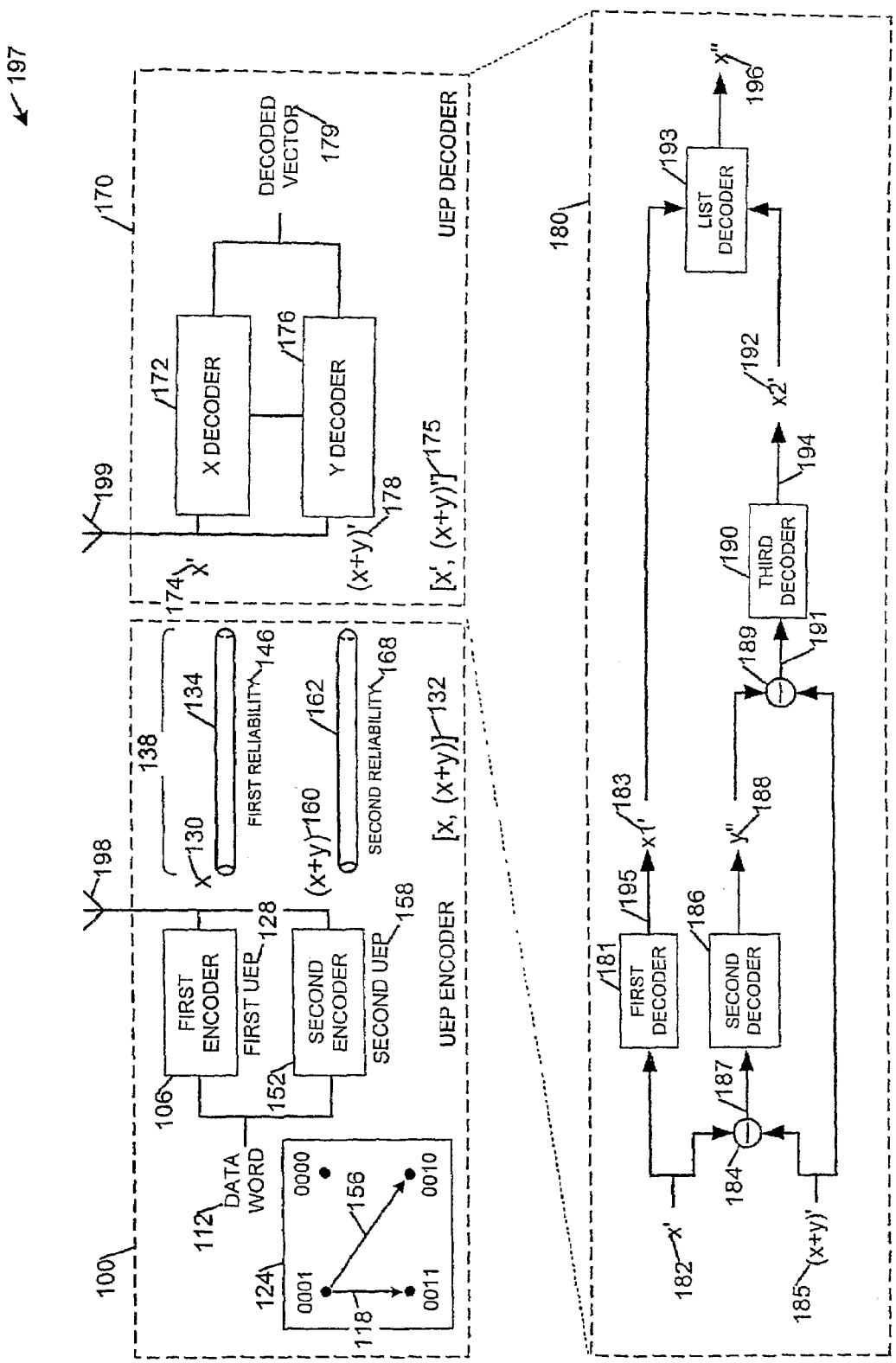
FIG. 1 is a block diagram of apparatus and systems according to various embodiments of the invention.

FIG. 1 comprises a block diagram of apparatus 100, 170, 180 and systems 197 according to various embodiments of the invention. Some of the embodiments disclosed herein may operate in an FEC environment to provide a range of error protection levels to various portions of a codeword.

Thus, for example, a data word may be encoded using two or more error-correcting codes of different rates and correction capabilities, resulting in an unequal error protection (UEP) codeword. The codeword may comprise two or more sub-parts, each protected according to a level of protection corresponding to the UEP code used to encode the sub-part. In some embodiments of the invention, greater-protected sub-parts may be allocated for transmission across less reliable communication channels, with lesser-protected sub-parts allocated to more reliable channels. In this context, channel reliability may be determined at a time prior to encoding, or may be determined dynamically upon receipt of the encoded sub-part. Parallel decoding of the codeword may be possible, and may represent a benefit compared to serially decoding a codeword encoded using multiple conventional codes. This allocation scheme may operate to reduce a difference in sub-channel transfer coefficients among the various sub-channels, and may increase system throughput.

In the interest of clarity, various embodiments may describe first and second UEP codes used to encode first and second portions of a UEP codeword associated with first and second channel subsets, respectively. Such usage is to be understood as merely one possible example among many, and not as a limitation. Thus, various embodiments may include a plurality N of UEP codes and portions of the UEP codeword associated with N sub-channel subsets.

Therefore, in some embodiments, the apparatus 100 may include a first encoder 106 to encode a data word 112 at a first code distance 118 within a selected bit constellation 124 utilizing a first unequal error protection (UEP) code 128 to yield a first portion 130 of a UEP codeword 132. The data word 112 may be encoded for transmission across a first channel subset 134 of a multi-channel communications link 138, wherein the first channel subset 134 is associated with a first channel reliability 146.

The apparatus 100 may also include a second encoder 152 to encode the data word 112 at a second code distance 156 utilizing a second UEP code 158 to yield a second portion 160 of the UEP codeword 132. One or more of the first UEP code 128 and the second UEP code 158 may comprise a low-density parity-check (LDPC) code, among other types of codes. The first code distance, the second code distance, or both may be associated with one or more parity-check matrix columns associated with the first UEP code, the second UEP code, or both. The data word 112 may be encoded for transmission across a second channel subset 162 of the multi-channel communications link 138. In some embodiments of the apparatus 100, the second channel subset 162 may be associated with a second channel reliability 168, the first code distance 118 may differ from the second code distance 156, and the first channel reliability 146 may differ from the second channel reliability 168.

In some embodiments of the apparatus 100, the absolute value of the difference between the first code distance 118 and the second code distance 156 may vary inversely with the absolute value of the difference between the first channel reliability 146 and the second channel reliability 168. That is, portions of a codeword may be encoded with higher levels of redundancy for transmission across channels experiencing lower reliability, perhaps due to noise or channel fade problems; and the relationship may be an inversely proportional one. Thus, an error rate associated with noisier channels may be reduced while decreasing FEC overhead associated with cleaner channels. An overall increase in system throughput may result.

Other embodiments may be realized. An apparatus 170 may include one or more of the apparatus 100. The apparatus 170 may also include a first decoder 172 to decode a first portion 174 of a received UEP codeword 175 received on a first channel subset 134 of a multi-channel communications link 138. The apparatus 170 may further include a second decoder 176 to decode a second portion 178 of the UEP codeword 175 received on a second channel subset 162 of the multi-channel communications link 138. In some embodiments of the apparatus 100, the first decoder 172, the second decoder 176, or both may comprise bit-loading decoders. Thus, the apparatus 170 may yield a decoded vector 179, wherein transfer coefficients associated with portions of the vector 179 are substantially equalized.

Yet other embodiments may be realized. An apparatus 180 may include one or more of the apparatus 100 and a first decoder 181 to decode a first portion 182 of a UEP codeword 175 received on a first channel subset 134 to obtain a first estimated first decoded vector component 183.

The apparatus 180 may also include a first compensation module 184 to compensate a second portion 185 of the UEP codeword 175 received on a second channel subset 162, the second portion 185 compensated using the first portion 182. The apparatus 180 may further include a second decoder 186 coupled to the first compensation module 184 to decode an output 187 of the first compensation module 184 to obtain a second decoded vector component 188.

The apparatus 180 may include a second compensation module 189 coupled to an output of the second decoder 186 to compensate the second portion 185 of the UEP codeword 175 received on the second channel subset 162 using the second decoded vector component 188. The apparatus 180 may also include a third decoder 190 coupled to the second compensation module 189 to decode an output 191 of the second compensation module 189 to obtain a second estimated first decoded vector component 192.

The apparatus 180 may further include a list decoder 193 coupled to an output 194 of the third decoder 190 and to an output 195 of the first decoder 181 to perform a list decode operation on the first estimated first decoded vector component 183 and on the second estimated first decoded vector component 192 to obtain a first decoded vector component 196. The list decoder 193 may comprise a belief propagation decoder (e.g., a decoder based upon a belief-propagation algorithm), a min-sum decoder, a Bahl-Cocke-Jelinek-Raviv (BCJR) decoder, or a soft-output Viterbi algorithm (SOVA) decoder, for example. The first decoder 181, the second decoder 186, and the third decoder 190 may each comprise an LDPC decoder, among other types.

Other embodiments may be realized. A system 197 may include one or more of an apparatus 100, an apparatus 170, and an apparatus 180 (individually or in combination). Thus, the system 197 may include a first encoder 106 to encode a data word 112 at a first code distance 118 within a selected bit constellation 124 utilizing a first unequal error protection (UEP) code 128 to yield a first portion 130 of a UEP codeword 132, as previously mentioned. The data word 112 may be encoded for transmission across a first channel subset 134 of a multi-channel communications link 138, wherein the first channel subset 134 is associated with a first channel reliability 146.

The multi-channel communications link 138 may comprise an OFDM link, a discrete multi-tone link, or both. The OFDM link may be used in wired communications (e.g., asymmetric digital subscriber line) or in wireless communications. In wireless communications, the OFDM link may be designed to operate according to an Institute of Electrical and Electronic Engineers (IEEE) 802.11 specification, an IEEE 802.15 specification, or an IEEE 802.16 specification. For additional information regarding IEEE 802.11 standards, please refer to "IEEE Standards for Information Technology—Telecommunications and Information Exchange between Systems—Local and Metropolitan Area Network—Specific Requirements—Part 11: Wireless LAN Medium Access Control (MAC) and Physical Layer (PHY), ISO/IEC 8802-11: 1999" and related amendments.

The system 197 may also include a second encoder 152 to encode the data word 112 at a second code distance 156 utilizing a second UEP code 158 to yield a second portion 160 of the UEP codeword 132. The first UEP code, the second UEP code, or both may comprise LDPC codes. In some embodiments of the apparatus 100, the absolute value of the difference between the first code distance 118 and the second code distance 156 may vary inversely with the absolute value of the difference between the first channel reliability 146 and the second channel reliability 168.

The data word 112 may be encoded for transmission across a second channel subset 162 of the multi-channel communications link 138. In some embodiments of the system 197, the first channel subset 134 and the second channel subset 162 may comprise communications channels defined according to an IEEE 802.11 specification, an IEEE 802.15 specification, an IEEE 802.16 specification, or a discrete multi-tone (DMT) transmission scheme. For additional information regarding DMT, please refer to "Perfect Discrete Multitone Modulation with Optimal Transceivers" by Yuan-Pei Lin and See-May Phoong, IEEE Transactions On Signal Processing, Vol. 48, No. 6, June 2000.

The system 197 may also include a first decoder 181, a first compensation module 184, a second decoder 186, a second compensation module 189, a third decoder 190, and a list decoder 193. The system 197 may further include antennas 198, 199 comprising patch, omnidirectional, beam, monopole, dipole, or rhombic antennas, among others, coupled to the first encoder 106 and second encoder 152, and to the first decoder 172 and second decoder 176, respectively.

The apparatus 100, 170, 180; systems 197; encoders 106, 152; data word 112; code distances 118, 156; bit constellation 124; codes 128, 158; channel subsets 134, 162; communications link 138; codeword portions 130, 160, 174, 178, 182, 185; codewords 132, 175; channel reliabilities 146, 168; decoders 172, 176, 181, 186, 190, 193; vector 179; vector components 183, 188, 192, 196; compensation modules 184, 189; module outputs 187, 191, 194, 195; and antennas 198, 199 may all be characterized as "modules" herein.

Such modules may include hardware circuitry, single or multi-processor circuits, memory circuits, software program modules and objects, firmware, and combinations thereof, as desired by the architect of the apparatus 100, 170, 180 and systems 197 and as appropriate for particular implementations of various embodiments. The modules may be included in a system operation simulation package such as a software electrical signal simulation package, a power usage and distribution simulation package, a capacitance-inductance simulation package, a power/heat dissipation simulation package, a signal transmission-reception simulation package, or any combination of software and hardware used to simulate the operation of various potential embodiments. These simulations may be used to characterize or test the embodiments, for example.

It should also be understood that the apparatus and systems of various embodiments can be used in applications other than encoding a message sub-part with a level of FEC protection corresponding to a reliability of a channel used to transmit the sub-part in a multi-channel communications system. Thus, various embodiments are not to be so limited. The illustrations of apparatus 100, 170, 180 and systems 197 are intended to provide a general understanding of the structure of various embodiments, and are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers, workstations, radios, video players, vehicles, and others.

Figure 2:
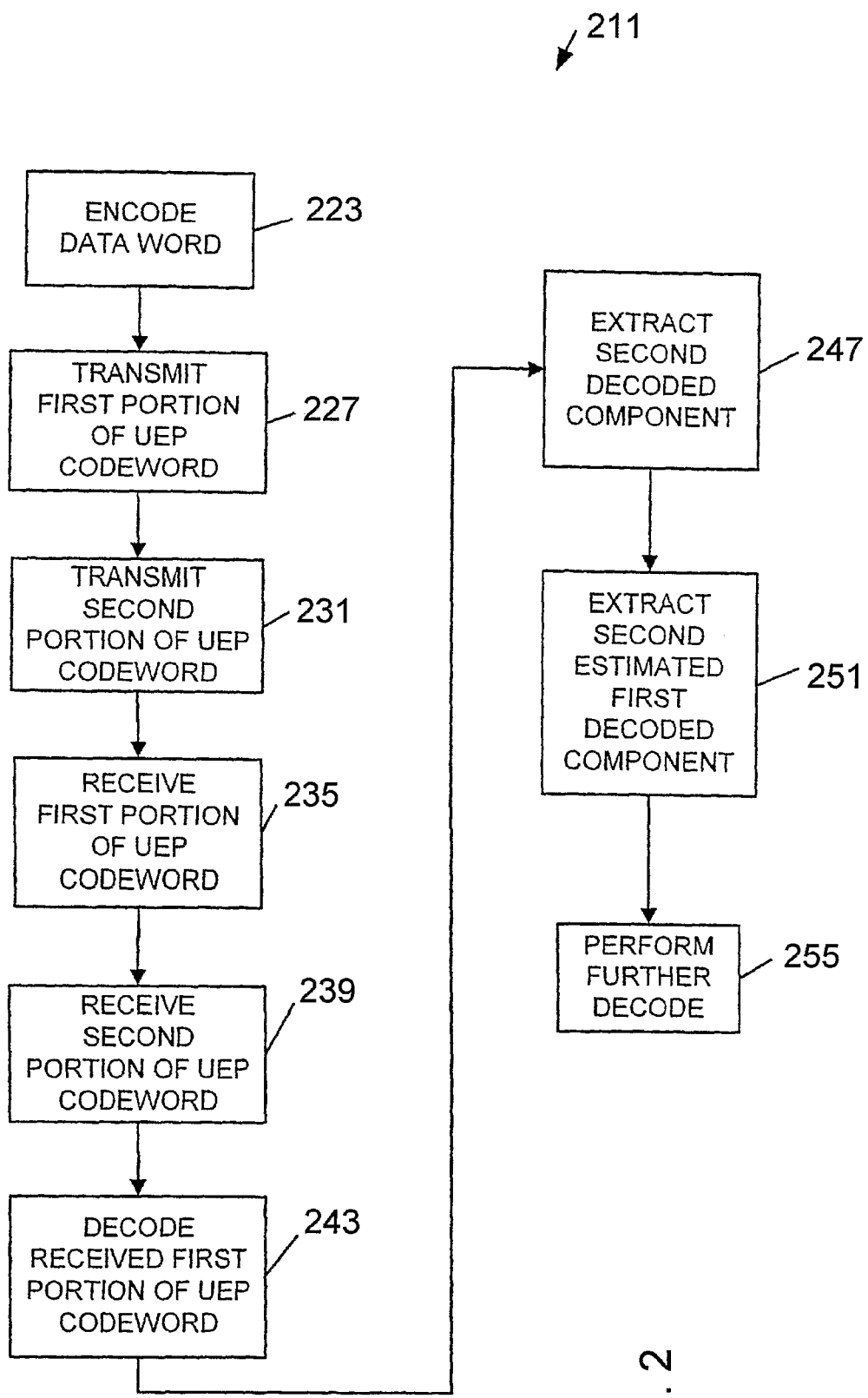
FIG. 2 is a flow diagram illustrating several methods according to various embodiments of the invention.

Some embodiments may include a number of methods. FIG. 2 is a flow diagram illustrating several methods 211 according to various embodiments of the invention. One such method 211 may begin with encoding a data word into a UEP codeword, perhaps utilizing a plurality of UEP codes, at block 223. The plurality of UEP codes may comprise one or more LDPC codes, among others.

The method 211 may continue at block 227 with transmitting a first portion of the UEP codeword associated with a first protection level across a first sub-channel subset associated with a first error probability and a multi-channel communications link. The method 211 may include transmitting a second portion of the UEP codeword associated with a second protection level across a second sub-channel subset associated with a second error probability and the multi-channel communications link at block 231. The first sub-channel subset, the second sub-channel subset, or both may comprise communication channels defined according to an IEEE 802.11 specification, an IEEE 802.15 specification, an IEEE 802.16 specification, or a DMT transmission scheme.

In some embodiments, the first protection level may be proportional to a first code distance associated with one or more parity-check matrix columns corresponding to the first portion of the UEP codeword. Similarly, the second protection level may be proportional to a second code distance associated with one or more parity-check matrix columns corresponding to the second portion of the UEP codeword. The absolute value of the difference between the first protection level and the second protection level may be proportional to the absolute value of the difference between the first error probability and the second error probability associated with the first and second sub-channels subsets, respectively.

Thus, the method 211 may comprise substantially equalizing sub-channel transfer coefficients by receiving the first portion of the UEP codeword on the first sub-channel subset at block 235, and receiving the second portion of the UEP codeword on the second sub-channel subset at block 239. To achieve substantial equalization of coefficients, it may be useful to set the reliabilities associated with the first sub-channel subset, the second sub-channel subset, or both to vary inversely with the level of forward error correction protection associated with a portion of the UEP codeword. One or more bits associated with the received first portion of the UEP codeword, the received second portion of the UEP codeword, or both, may comprise soft bits.

The method 211 may further include decoding the received first portion of the UEP codeword to obtain a first estimated first decoded vector component at block 243. The method 211 may continue at block 247 with extracting a second decoded vector component by compensating the received second portion of the UEP codeword using the received first portion and by decoding a result of the compensation.

The method 211 may include extracting a second estimated first decoded vector component by compensating the received second portion of the UEP codeword using the second decoded vector component and by decoding a result of the compensation, at block 251. The method 211 may conclude with performing a further decode operation on the first estimated first decoded vector component and on the second estimated first decoded vector component to obtain a first decoded vector component, at block 255. It should be noted that the methods described herein do not have to be executed in the order described, or in any particular order. Moreover, various activities described with respect to the operations identified herein can be executed in repetitive, serial, or parallel fashion. Information, including parameters, commands, operands, and other data, can be sent and received over conductors or in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using a number of mechanisms well known to those skilled in the art, such as application program interfaces or interprocess communication techniques, including remote procedure calls. The teachings of various embodiments are not limited to any particular programming language or environment.

Figure 3:
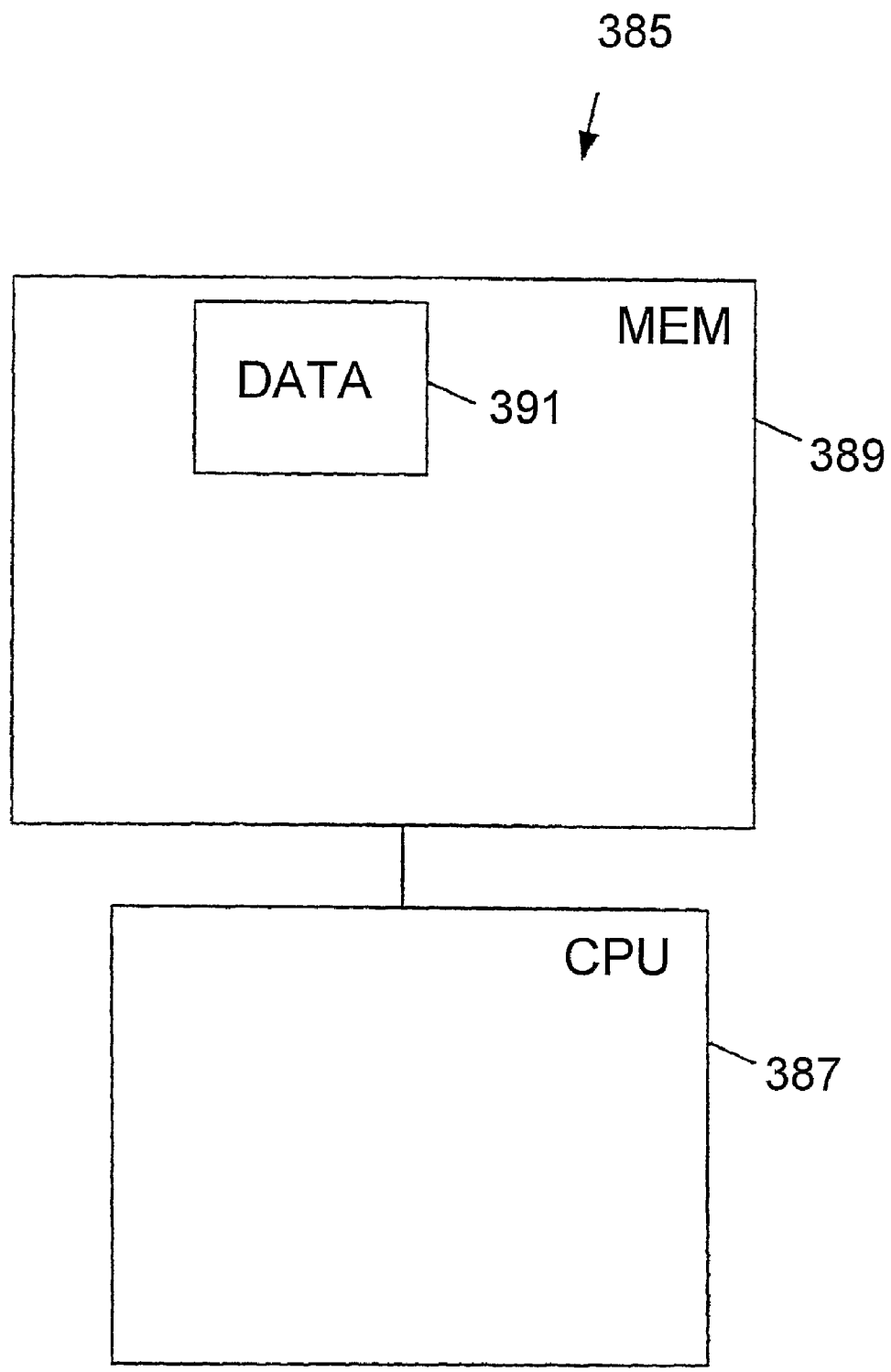
FIG. 3 is a block diagram of an article according to various embodiments of the invention.

Other embodiments may be realized. For example, FIG. 3 is a block diagram of an article 385 according to various embodiments of the invention. Examples of such embodiments may comprise a memory system, a magnetic or optical disk, or some other storage device. The article 385 may include one or more processor(s) 387 coupled to a machine-accessible medium such as a memory 389 (e.g., a memory including an electrical, optical, or electromagnetic conductor). The medium may contain associated information 391 (e.g., computer program instructions, data, or both) which, when accessed, results in a machine (e.g., the processor(s) 387) encoding a data word into a UEP codeword.

Other activities may include transmitting a first portion of the UEP codeword associated with a first protection level across a first sub-channel subset associated with a first error probability and a multi-channel communications link. Additional activities may include transmitting a second portion of the UEP codeword associated with a second protection level across a second sub-channel subset associated with a second error probability and the multi-channel communications link, as well as receiving soft bits associated with a portion of the UEP codeword. The first sub-channel subset, the second sub-channel subset, or both may comprise communication channels defined according to an IEEE 802.11 specification, an IEEE 802.15 specification, an IEEE 802.16 specification, or a DMT transmission scheme.

Implementing the apparatus, systems, and methods disclosed herein may operate to encode a portion of a UEP codeword with a selected level of error protection for transmission on a communications sub-channel associated with a particular reliability. A reduction in the differential between sub-channel transfer coefficients and an increase in system throughput may result.

Although the inventive concept may include embodiments described in the exemplary context of an 802.xx implementation (e.g., 802.11a, 802.11g, 802.11 HT, 802.16, etc.), the claims are not so limited. Embodiments of the present invention may be implemented as part of any wired or wireless system Examples may also include embodiments comprising multi-carrier wireless communication channels (e.g., OFDM, DMT, etc.) such as may be used within a wireless personal area network (WPAN), a wireless local area network (WLAN), a wireless metropolitan are network (WMAN), a wireless wide area network (WWAN), a cellular network, a third generation (3G) network, a fourth generation (4G) network, a universal mobile telephone system (UMTS), and like communication systems, without limitation.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, including:
a first encoder to encode a data word at a first code distance within a selected bit constellation utilizing a first unequal error protection (UEP) code to yield a first portion of a UEP codeword to be transmitted across a first channel subset of a multi-channel communications link, wherein the first channel subset is associated with a first channel reliability; and
a second encoder to encode the data word at a second code distance utilizing a second UEP code to yield a second portion of the UEP codeword to be transmitted across a second channel subset of the multi-channel communications link, wherein the second channel subset is associated with a second channel reliability, the first code distance differs from the second code distance, the first channel reliability differs from the second channel reliability, and at least one of the first UEP code and the second UEP code comprises a low-density parity-check code.

2. The apparatus of claim 1, further including:
a first decoder to decode a received first portion of the UEP codeword, received on the first channel subset of the multi-channel communications link; and
a second decoder to decode a received second portion of the UEP codeword, received on the second channel subset of the multi-channel communications link.

3. The apparatus of claim 2, wherein the first decoder and the second decoder comprise bit-loading decoders.

4. An apparatus, including:
a first encoder to encode a data word at a first code distance within a selected bit constellation utilizing a first unequal error protection (UEP) code to yield a first portion of a UEP codeword to be transmitted across a first channel subset of a multi-channel communications link, wherein the first channel subset is associated with a first channel reliability; and
a second encoder to encode the data word at a second code distance utilizing a second UEP code to yield a second portion of the UEP codeword to be transmitted across a second channel subset of the multi-channel communications link, wherein the second channel subset is associated with a second channel reliability, the first code distance differs from the second code distance, and the first channel reliability differs from the second channel reliability,
wherein the absolute value of the difference between the first code distance and the second code distance varies inversely with the absolute value of the difference between the first channel reliability and the second channel reliability.

5. The apparatus of claim 4, further including:
a first decoder to decode a received first portion of the UEP codeword, received on the first channel subset to obtain a first estimated first decoded vector component;
a first compensation module to compensate a received second portion of the UEP codeword, received on the second channel subset, the received second portion compensated using the first portion;
a second decoder coupled to the first compensation module to decode an output of the first compensation module to obtain a second decoded vector component;
a second compensation module coupled to an output of the second decoder to compensate the second portion of the received UEP codeword, received on the second channel subset using the second decoded vector component;
a third decoder coupled to the second compensation module to decode an output of the second compensation module to obtain a second estimated first decoded vector component; and
a list decoder coupled to an output of the third decoder and to an output of the first decoder to perform a list decode operation on the first estimated first decoded vector component and on the second estimated first decoded vector component to obtain a first decoded vector component.

6. The apparatus of claim 5, wherein at least one of the first decoder, the second decoder, and the third decoder comprises a low-density parity-check decoder.

7. The apparatus of claim 5, wherein the list decoder comprises at least one of a belief propagation decoder, a min-sum decoder, a Bahl-Cocke-Jelinek-Raviv (BCJR) decoder, and a soft-output Viterbi algorithm (SOVA) decoder.

8. A system, including:
a first encoder to encode a data word at a first code distance within a selected bit constellation utilizing a first unequal error protection (UEP) code to yield a first portion of a UEP codeword to be transmitted across a first channel subset of a multi-channel communications link, wherein the first channel subset is associated with a first channel reliability;
a second encoder to encode the data word at a second code distance utilizing a second UEP code to yield a second portion of the UEP codeword to be transmitted across a second channel subset of the multi-channel communications link, wherein the second channel subset is associated with a second channel reliability, the first code distance differs from the second code distance, the first channel reliability differs from the second channel reliability, and at least one of the first UEP code and the second UEP code comprises a low-density parity-check code; and
a first omnidirectional antenna coupled to the first encoder and to the second encoder.

9. The system of claim 8, further including:
a first decoder to decode a received first portion of the UEP codeword, received on the first channel subset of the multi-channel communications link;
a second decoder to decode a received second portion of the UEP codeword, received on the second channel subset of the multi-channel communications link; and
a second omnidirectional antenna coupled to the first decoder and to the second decoder.

10. The system of claim 9, wherein the first channel subset and the second channel subset comprise communications channels defined according to at least one of an Institute of Electrical and Electronic Engineers (IEEE) 802.11 specification, an IEEE 802.15 specification, an IEEE 802.16 specification, and a discrete multi-tone (DMT) transmission scheme.

11. The system of claim 9, wherein the multi-channel communications link comprises at least one of an orthogonal frequency-division multiplexing (OFDM) link and a discrete multi-tone link.

12. The system of claim 11, wherein the OFDM link is designed to operate according to at least one of an Institute of Electrical and Electronic Engineers (IEEE) 802.11 specification, an IEEE 802.15 specification, and an IEEE 802.16 specification.

13. A system, including:
a first encoder to encode a data word at a first code distance within a selected bit constellation utilizing a first unequal error protection (UEP) code to yield a first portion of a UEP codeword to be transmitted across a first channel subset of a multi-channel communications link, wherein the first channel subset is associated with a first channel reliability;
a second encoder to encode the data word at a second code distance utilizing a second UEP code to yield a second portion of the UEP codeword to be transmitted across a second channel subset of the multi-channel communications link, wherein the second channel subset is associated with a second channel reliability, the first code distance differs from the second code distance, the first channel reliability differs from the second channel reliability;
a first omnidirectional antenna coupled to the first encoder and to the second encoder;
a first decoder to decode a received first portion of the UEP codeword, received on the first channel subset of the multi-channel communications link;
a second decoder to decode a received second portion of the UEP codeword, received on the second channel subset of the multi-channel communications link; and
a second omnidirectional antenna coupled to the first decoder and to the second decoder,
wherein the absolute value of the difference between the first code distance and the second code distance varies inversely with the absolute value of the difference between the first channel reliability and the second channel reliability.

14. A method including substantially equalizing sub-channel transfer coefficients by:
encoding a data word into an unequal error protection (UEP) codeword;
transmitting a first portion of the UEP codeword associated with a first protection level across a first sub-channel subset associated with a first error probability and with a multi-channel communications link;
transmitting a second portion of the UEP codeword associated with a second protection level across a second sub-channel subset associated with a second error probability and with the multi-channel communications link;
receiving a received first portion of the UEP codeword on the first sub-channel subset; and
receiving a received second portion of the UEP codeword on the second sub-channel subset, wherein a reliability associated with at least one of the first sub-channel subset and the second sub-channel subset is inversely proportional to a level of forward error correction protection associated with a portion of the UEP codeword.

15. The method of claim 14, further including:
decoding the received first portion of the UEP codeword to obtain a first estimated first decoded vector component;
extracting a second decoded vector component by compensating the received second portion of the UEP codeword using the received first portion and by decoding a result of the compensation;
extracting a second estimated first decoded vector component by compensating the received second portion of the UEP codeword using the second decoded vector component and by decoding a result of the compensation; and
performing a further decode operation on the first estimated first decoded vector component and on the second estimated first decoded vector component to obtain a first decoded vector component.

16. The method of claim 15, wherein a bit associated with at least one of the received first portion of the UEP codeword and the received second portion of the UEP codeword comprises a soft bit.

17. The method of claim 14, wherein the first protection level is proportional to a first code distance associated with at least one parity-check matrix column corresponding to the first portion of the UEP codeword, and wherein the second protection level is proportional to a second code distance associated with at least one parity-check matrix column corresponding to the second portion of the UEP codeword.

18. The method of claim 14, wherein the absolute value of the difference between the first protection level and the second protection level varies directly with the absolute value of the difference between the first error probability and the second error probability.

19. The method of claim 14, wherein the UEP codeword is encoded utilizing a plurality of UEP codes.

20. The method of claim 19, wherein the plurality of UEP codes comprises at least one low-density parity-check (LDPC) code.

21. An article including a machine-accessible medium having associated information, wherein the information, when accessed, results in a machine performing:

encoding a data word into an unequal error protection (UEP) codeword utilizing a plurality of UEP codes, wherein the plurality of UEP codes comprises at least one low-density parity-check (LDPC) code;

transmitting a first portion of the UEP codeword associated with a first protection level across a first sub-channel subset associated with a first error probability and with a multi-channel communications link; and transmitting a second portion of the UEP codeword associated with a second protection level across a second sub-channel subset associated with a second error probability and with the multi-channel communications link.

22. The article of claim 21, wherein the information, when accessed, results in a machine performing:

receiving soft bits associated with a portion of the UEP codeword.

23. The article of claim 21, wherein at least one of the first sub-channel subset and the second sub-channel subset comprises communication channels defined according to at least one of an Institute of Electrical and Electronic Engineers (IEEE) 802.11 specification, an IEEE 802.15 specification, an IEEE 802.16 specification, and a discrete multi-tone (DMT) transmission scheme.

* * * * *

UNITED STATES PATENT AND TRADEMARK OFFICE
CERTIFICATE OF CORRECTION

| | | |
|---|---|---|
| PATENT NO. | : 7,856,584 B2 | |
| APPLICATION NO. | : 11/577035 | |
| DATED | : December 21, 2010 | |
| INVENTOR(S) | : Andrei A. Ovchinnikov et al. | |

It is certified that error appears in the above-identified patent and that said Letters Patent is hereby corrected as shown below:

On the face page, in field (56), under "Foreign Patent Documents", in column 2, line 1, delete "SU" and insert -- RU --, therefor.

Signed and Sealed this
Twenty-second Day of March, 2011

David J. Kappos
*Director of the United States Patent and Trademark Office*